United States Patent [19]

Rinnovatore

[11] Patent Number: 5,397,596
[45] Date of Patent: Mar. 14, 1995

[54] METHOD OF REDUCING PARTICULATE CONTAMINANTS IN A CHEMICAL-VAPOR-DEPOSITION SYSTEM

[75] Inventor: James V. Rinnovatore, Nazareth, Pa.

[73] Assignee: Applied Materials, Inc., Santa Clara, Calif.

[21] Appl. No.: 162,811

[22] Filed: Dec. 3, 1993

Related U.S. Application Data

[60] Continuation of Ser. No. 949,390, Sep. 22, 1992, abandoned, which is a division of Ser. No. 545,425, Jun. 28, 1990, Pat. No. 5,188,672.

[51] Int. Cl.⁶ ............................................. C23C 16/00
[52] U.S. Cl. ................................. 427/248.1; 118/719
[58] Field of Search ...................... 427/248.1; 118/715, 118/725, 719

[56] References Cited

U.S. PATENT DOCUMENTS

| | | | |
|---|---|---|---|
| 3,338,209 | 8/1967 | Bhola | 118/715 |
| 4,282,267 | 8/1981 | Kuyel. | |
| 4,583,492 | 4/1986 | Cowher et al. | |
| 4,807,562 | 2/1989 | Sandys | 118/715 |
| 4,834,022 | 5/1989 | Mahawili. | |
| 4,838,201 | 6/1989 | Fraas et al. | |
| 4,992,044 | 2/1991 | Philipossian. | |
| 5,038,711 | 8/1991 | Dan et al. | 118/715 |

FOREIGN PATENT DOCUMENTS

| | | |
|---|---|---|
| 0270991 | 6/1988 | European Pat. Off. |
| 2743909 | 4/1979 | Germany. |
| 5943861 | 9/1982 | Japan. |
| 59-52834 | 3/1984 | Japan. |
| 62-2319 | 1/1986 | Japan. |
| 61-111994 | 10/1986 | Japan. |
| 63-89492 | 4/1988 | Japan. |

Primary Examiner—Shrive Beck
Assistant Examiner—Bret Chen
Attorney, Agent, or Firm—Raymond R. Moser, Jr.; Peter J. Sgarbossa

[57] ABSTRACT

In a chemical-vapor-deposition system, a method of reducing particulate contamination within a reaction chamber. In general, the chemical-vapor-deposition system contains a gas inlet conduit which connects a reaction chamber to a reactive gas source and a gas outlet conduit which connects the reaction chamber to a vacuum pump. The vacuum pump facilitates exhausting gas from the reaction chamber. The method of reducing particulate contamination in the system includes the steps of: filling, via said inlet conduit, the reaction chamber with a reactive gas; exhausting the reactive gas from the reaction chamber using the vacuum pump; isolating the reaction chamber from the vacuum pump to cease exhausting the chamber; backfilling, via the inlet conduit, the reaction chamber with the reactive gas; and preventing, during the backfilling step, generation of eddy currents in a portion of the outlet conduit by providing a particle restrictor within the outlet conduit. To prevent the eddy currents that could cause particulate contaminants to enter the chamber from the outlet conduit, the particle restrictor contains a baffle that extends transversely across the outlet conduit.

3 Claims, 1 Drawing Sheet

METHOD OF REDUCING PARTICULATE CONTAMINANTS IN A CHEMICAL-VAPOR-DEPOSITION SYSTEM

CROSS REFERENCE TO RELATED APPLICATION

This application is a continuation of patent application Ser. No. 07/949,390, entitled "Method of Reducing Particulate Contaminants in a Chemical-Vapor-Deposition System" (as amended) filed on Sep. 22, 1992, now abandoned, which is a division, of application Ser. No. 07/545,425, filed Jun. 28, 1990, now U.S. Pat. No. 5,188,672.

BACKGROUND OF THE INVENTION

The present invention relates generally to the field of semiconductor wafer fabrication equipment useful in the manufacture of semiconductor devices, more particularly to chemical vapor deposition (CVD) apparatus useful for depositing a variety of different types of layers from a source gas onto a substrate, and especially to improvements resulting in a reduction of particulate contamination in such apparatus.

Apparatus of the above type is used in the fabrication of semiconductor devices on 100 millimeter or larger wafers of silicon. Epitaxial layers are formed on the surfaces of the wafers by heating them to temperatures in the region of 800 to 1200 degrees Celsius in a bell jar containing a gaseous atmosphere consisting of a hydrogen carrier gas mixed with one or more reactive gases such as a silicon source gas and a dopant source gas.

During the various processing steps which are used to produce layers of different types on the surfaces of the wafers, great care must be taken to avoid the deposition of particulate contaminants on the surfaces of the wafers. The demand for ever larger scale of circuit integration and the consequent need for greater chip density have made the elimination of particulate contaminants an increasingly difficult problem. As the size of the circuit features has become smaller, the minimum size of particulate contaminants which can degrade circuit performance has also become smaller. This is true because particles as small as 1/10 the size of the circuit features can seriously degrade the electrical properties of the circuit.

One source of such contaminants is the exhaust line used to conduct gases from the interior of the bell jar when they are no longer needed. Such an exhaust line may terminate in a sump at atmospheric pressure or may connect the processing system to a source of high vacuum such as a vacuum pump. During normal processing this line is open to the vacuum pump, such that there is a steady flow of gases, including entrained particulate contaminants, in a direction away from the reaction chamber.

However, when a processing step has been completed, a valve in the exhaust line is closed while the reaction chamber is back-filled with a new processing atmosphere through an inlet line. During this back-filling operation, strong currents of moving gases in the reaction chamber can sweep up and entrain particulate contaminants from the region of the exhaust line near its junction with the reaction chamber.

The presence of contaminant particles in the short section of exhaust line between the valve and the reaction chamber is difficult to avoid, since some particulate matter is inevitably present in the effluent from the reaction chamber. However, the particle performance of the system could be improved if such particulate contaminants could be prevented, or at least inhibited, from returning to the reaction chamber during the back-filling operation.

SUMMARY OF THE INVENTION

An object of the present invention is to provide an epitaxial reactor system having improved particle performance compared to the prior art.

A further object of the present invention is to provide, in such a system having a reaction chamber with an exhaust line connected to either an exhaust sump or a vacuum pump, that particulate matter in the exhaust line is inhibited from re-entering the reaction chamber.

A further object of the present invention is to provide in such a system a baffle located at the junction of the exhaust line and the reaction chamber to prevent particulate matter in the exhaust line from re-entering the reaction chamber.

A further object of the present invention is to provide a baffle according to the immediately preceding object in a form which can be readily removed from the exhaust line when desired.

A further object of the present invention is to provide such a baffle in a form which causes the minimum practical flow restriction to gases traveling along the exhaust line from the reaction chamber to the vacuum pump.

To the above ends, a baffle for inhibiting the return of particulate matter from the exhaust line into the reaction chamber of a epitaxial reactor system extends transversely across the mouth of the exhaust line and has a central aperture of a smaller cross-sectional area than the exhaust line. The baffle has a concave surface facing the reaction chamber, and a convex surface facing the interior of the exhaust line.

During normal operation of the epitaxial reactor system, the vacuum system is in operation to remove normal waste byproducts and particulate contaminants from the system. In this mode of operation, the central aperture in the baffle is sufficiently large in cross section to cause only a minimal flow restriction.

At the completion of a processing step, when the vacuum pump is isolated from the reaction chamber by the closure of a valve in the exhaust line, the reaction chamber is back-filled with a new processing atmosphere via an inlet line. The strong convection currents of gas in the reaction chamber are prevented from generating eddy currents in the portion of the exhaust line near its junction with the wall of the reaction chamber by the presence of the baffle.

BRIEF DESCRIPTION OF THE DRAWING

The above and other features, objects and advantages of the present invention together with the best mode known to the inventor thereof for carrying out his invention will become more apparent from reading the following description of the invention while studying the associated drawing, the various figures of which represent.

DETAILED DESCRIPTION OF THE PRESENT INVENTION

Figures 1, 2:
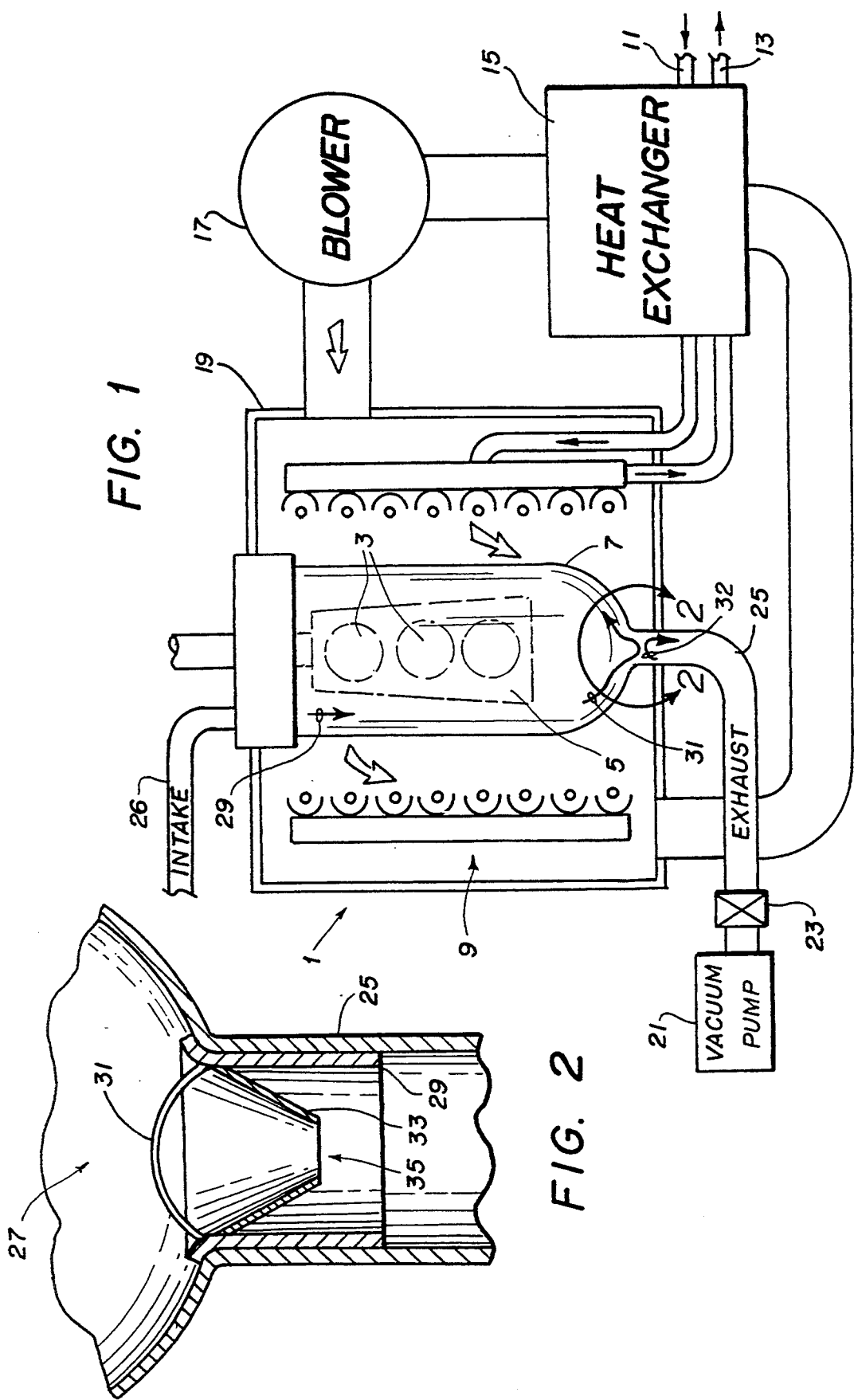
FIG. 1 is a cross-sectional view, in somewhat schematic form, of a CVD epitaxial reactor system incorporating the present invention.
FIG. 2 is a detailed sectional view of the portion of FIG. 1 within the line 2—2 in FIG. 1.

FIG. 1 illustrates a chemical-vapor-deposition system 1 in a form such as might be used for producing epitaxial layers on silicon wafers during the fabrication of semiconductor devices. System 1 is shown in a schematic and generalized manner to permit explanation of the context within which the present invention operates.

A plurality of substrates 3, which might be 150 millimeter silicon wafers, for example, are supported on a graphite susceptor 5 for processing in a gaseous environment confined within a quartz bell jar 7. Banks of radiant heaters 9 surround the bell jar for heating the susceptor and substrates to processing temperatures in the region of 800–1200 degrees Celsius.

Cooling water from an external source (not shown) flows into system 1 via a coolant inlet line 11 and returns from the system via a coolant outlet line 13. Within system 1, the cooling water extracts heat from the banks of radiant heaters 9 and from an air-to-water heat exchanger 15.

Heat exchanger 15 is part of a recirculating air cooling system which includes a blower 17 to drive a steady stream of cool air from exchanger 15 into a reactor enclosure 19, from which the heated air returns to heat exchanger 15. Within enclosure 19, a stream of cooling air envelops and flows downwardly over the surface of bell jar 7 to maintain its temperature low enough to prevent unwanted reactions between the inner surface of bell jar 7 and the reactive gaseous atmosphere within.

Typically, the processing of silicon-wafer substrates proceeds through a series of steps involving exposure to different gaseous atmospheres within bell jar 7. During these steps various waste products, including particulate contaminants, are continuously removed from the interior of bell jar 7 by a vacuum system which includes a vacuum pump 21 coupled to a valve 23 which is in turn coupled to bell jar 7 by an exhaust line 25.

Filling of bell jar 7 at the start of each processing cycle takes place through an intake line 26, from which the gaseous atmosphere flows downwardly as indicated by arrow 29. During this backfilling operation, valve 23 is closed, such that the section of exhaust line 25 between valve 23 and bell jar 7 is isolated from vacuum pump 21. As suggested by arrow 31, the backfilling gaseous atmosphere sweeps over the hemispherical bottom surface of bell jar 7, deviating slightly into the mouth of exhaust line 25 near its junction with jar 7.

Although the exact pattern of gas flow in this region is unknown, it is believed that eddy currents, as suggested by arrow 32, are probably induced in the portion of exhaust line 25 near the bottom of jar 7. These eddy currents are believed responsible for dislodging particulate matter which was deposited on the inside wall of exhaust line 25 during the preceding processing steps. Once dislodged, such particulate matter can be entrained in the flow of gas across the mouth of exhaust line 25.

Whatever the actual flow pattern, it is known that the back-filling operation results in the reversion of considerable particulate matter from the walls of exhaust line 25 into the interior of bell jar 7. Once in bell jar 7, this particulate contamination is free to deposit on the wafers 3.

Turning now to FIG. 2, the region of FIG. 1 near the junction of exhaust line 25 and bell jar 7 is shown in enlarged section. In particular, and in accordance with the present invention, a particle restrictor 27 has been illustrated positioned within and extending across the mouth of exhaust line 25.

Particle restrictor 27 includes a ranged sleeve 29 which is dimensioned to easily slip into the mouth of exhaust line 25 at its junction with bell jar 7. A curved handle 31, which may be of round cross section and approximately ⅛ inch in diameter, permits easy insertion and removal of restrictor 27. A baffle 33 is joined around its upper rim to sleeve 29 and extends generally downwardly therefrom to terminate in a reduced-diameter aperture 35.

Baffle 33 has been illustrated in its preferred shape, which is that of a truncated conical section. However, baffle 33 might alternatively have any other shape which is concave as viewed from the side facing into bell jar 7. For example, baffle 33 might be a hemisphere or other portion of a sphere, or might have some other aspherical concave shape. However, a truncated conical shape is relatively easy to fabricate and has been found to provide a considerable reduction in the reversion of particulate contamination from exhaust line 25.

The exact nature of the gaseous flow which results in this reduction in particulate contamination has not been fully analyzed. However, it is believed that two mechanisms may be involved: (1) a decoupling of the gas within exhaust line 25 from the pattern of swirling gases which occurs in bell jar 7 during back-filling, reducing the generation of eddy currents in exhaust line 25; and (2) a tendency to trap a large percentage of any mobile particles in exhaust line 25, especially in the region between the lower surface of baffle 33 and the adjacent portions of sleeve 29.

The second of these two mechanisms suggests that the convex shape of baffle 33 as viewed from the side facing into exhaust line 25 also contributes to the performance in reducing particle contamination. Such a convex shape produces, between baffle 33 and the adjacent inner surface of sleeve 29, an annular region having a progressively converging shape which is well suited to trapping a majority of particles moving in a direction toward bell jar 7.

Particle restrictor 27 may be fabricated entirely of quartz, for example, such that its coefficient of thermal expansion matches that of bell jar 7 and exhaust line 25. Typical dimensions are: outer diameter of sleeve 29=4.0 inches; diameter of aperture 35=1.5 inches.

Although this invention has been described with some particularity with respect to a preferred embodiment thereof which represents the best mode known to the inventor for carrying out his invention, many changes could be made and many alternative embodiments could thus be derived without departing from the scope of the invention. In particular, although the invention has been described as being part of a chemical-vapor-deposition system 1 which is to be used primarily for epitaxial deposition on silicon wafers and which relies on a vacuum pump to exhaust spent processing atmospheres from the reaction chamber, the invention is not so limited. The invention can easily be incorporated in any other type of CVD system, including those which exhaust into a sump at atmospheric pressure. Consequently, the scope of the invention is to be determined only from the following claims.

I claim:

1. In a chemical-vapor-deposition system, a method of reducing particulate contamination in a reaction chamber, wherein a gas inlet conduit connects said reaction chamber to a source of reactive gas for filling said reaction chamber, wherein a gas outlet conduit having a cross-sectional area connects said reaction chamber to a means for producing a pressure differential in said outlet conduit for exhausting said gas from said reaction chamber, said method comprising the steps of:

filling, via said inlet conduit, said reaction chamber with a reactive gas from said gas source;

exhausting the reactive gas from said reaction chamber using said pressure differential producing means;

isolating said reaction chamber from said pressure differential producing means to cease exhausting the reaction chamber;

backfilling, via said inlet conduit, said reaction chamber with said reactive gas from said gas source; and preventing, during said backfilling step, generation of eddy currents within a portion of said outlet conduit by providing a particle restrictor within said outlet conduit, wherein said particle restrictor contains a baffle extending transversely across said outlet conduit, said baffle defines an aperture therethrough, said aperture having a cross-sectional area less than said cross-sectional area of said outlet conduit, said baffle having a convex face that faces into said outlet conduit.

2. The method of claim 1 in which the pressure differential is created by applying a vacuum to said gas outlet conduit.

3. The method of claim 1 wherein said outlet conduit joins a wall portion of said reaction chamber at a junction, said particle restrictor is positioned substantially at said junction and extends transversely across said outlet conduit.

* * * * *